United States Patent
Chan et al.

(10) Patent No.: US 12,549,092 B2
(45) Date of Patent: Feb. 10, 2026

(54) SIGNAL DELAY SETTING CIRCUIT, ISOLATION INTEGRATED CIRCUIT AND POWER CONVERSION CIRCUITRY

(71) Applicant: PowerX Semiconductor Corporation, Hsinchu County (TW)

(72) Inventors: Jui Teng Chan, Hsinchu County (TW); Yong Cyuan Chen, Hsinchu County (TW); Chung-Kang Wu, Hsinchu County (TW)

(73) Assignee: PowerX Semiconductor Corporation, Hsinchu County (TW)

( * ) Notice: Subject to any disclaimer, the term of this patent is extended or adjusted under 35 U.S.C. 154(b) by 261 days.

(21) Appl. No.: 18/413,064

(22) Filed: Jan. 16, 2024

(65) Prior Publication Data

US 2025/0132672 A1    Apr. 24, 2025

(30) Foreign Application Priority Data

Oct. 24, 2023   (TW) ................................ 112140655

(51) Int. Cl.
*H02M 1/38*     (2007.01)
*H02M 3/158*    (2006.01)
*H03K 5/13*     (2014.01)

(52) U.S. Cl.
CPC ............. *H02M 1/38* (2013.01); *H02M 3/158* (2013.01); *H03K 5/13* (2013.01)

(58) Field of Classification Search
CPC .......... H02M 1/38; H02M 3/158; H02M 1/08; H02M 1/0003; H02M 1/0006; H03K 5/13
See application file for complete search history.

(56) References Cited

U.S. PATENT DOCUMENTS

| | | | |
|---|---|---|---|
| 2017/0331471 A1 | 11/2017 | Yuzurihara et al. | |
| 2022/0103061 A1* | 3/2022 | Aoki | H02M 1/38 |
| 2025/0132671 A1* | 4/2025 | Chan | H02M 1/38 |

FOREIGN PATENT DOCUMENTS

| | | |
|---|---|---|
| CN | 1134885 C | 1/2004 |
| CN | 1809953 A | 7/2006 |

(Continued)

OTHER PUBLICATIONS

"UCC5870-Q1 30-A Isolated IGBT/SiC MOSFET Gate Driver with Advanced Protection Features for Automotive Applications", accessed at https://www.ti.com/lit/ds/symlink/ucc5870-q1.pdf?ts=1675653191570 &ref_url=https%253A%252F%252Fwww.google.com%252F, Sep. 1, 2021, Texas Instruments, U.S.A.

*Primary Examiner* — Alex Torres-Rivera

(74) *Attorney, Agent, or Firm* — CKC & Partners Co., LLC

(57) ABSTRACT

The application provides a signal delay setting circuit, an isolation integrated circuit and a power conversion circuitry. The isolation integrated circuit receives a first power voltage, receives a first input signal and a second input signal via two signal input terminals respectively, and outputs an output signal generated according to the first input signal and the second input signal. When the first power voltage is within a predetermined voltage range, the signal delay setting circuit generates a voltage difference across the two signal input terminals and calculates a delay time according to the voltage difference. When the first power voltage is greater than an upper limit of the predetermined voltage range, the signal delay setting circuit delays the first input signal or the second input signal according to the delay time to control the duty ratio of the output signal.

20 Claims, 6 Drawing Sheets

(56) References Cited

FOREIGN PATENT DOCUMENTS

| | | |
|---|---|---|
| CN | 115765711 A | 3/2023 |
| TW | 201238221 A | 9/2012 |
| TW | 201806304 A | 2/2018 |
| TW | M651267 U | 2/2024 |

* cited by examiner

SIGNAL DELAY SETTING CIRCUIT, ISOLATION INTEGRATED CIRCUIT AND POWER CONVERSION CIRCUITRY

CROSS-REFERENCE TO RELATED APPLICATION

This application claims priority to Taiwan Application No. 112140655 filed on Oct. 24, 2023, which is herein incorporated by reference in its entirety.

BACKGROUND

Field of Disclosure

This application relates to a signal delay setting circuit, and in particular, to a signal delay setting circuit applicable to an isolation integrated circuit.

Description of Related Art

In a circuit structure including a high-side switch and a low-side switch, it is usually necessary to alternately turn on the high-side switch and the low-side switch to complete an operation. However, the high-side switch and the low-side switch may be turned on at the same time due to some non-ideal factors, which may cause damage to the high-side switch and the low-side switch due to a high current flow.

Some related art techniques ensure that the high-side switch and low-side switch are not turned on at the same time by using RC circuit settings or using trimming methods to generate a dead zone or dead time. However, each of these related art techniques has its own problems. For example, a dead time generated by the related art techniques using an RC circuit may have a high deviation due to physical characteristics of a resistor and/or a capacitor. For example, related art techniques using trimming methods may increase the complexity of the entire system. Therefore, it is necessary to propose a new way to address the aforementioned issues.

SUMMARY

One aspect of this application is a signal delay setting circuit applicable to an isolation integrated circuit. The isolation integrated circuit includes a first signal input terminal, a second signal input terminal, and a signal output terminal, the first signal input terminal is configured to receive a first input signal, the second signal input terminal is configured to receive a second input signal, and the signal output terminal is configured to output an output signal generated according to the first input signal and the second input signal. The signal delay setting circuit includes a voltage drop generating circuit, a delay time control circuit, and a signal delay circuit. The voltage drop generating circuit is configured to generate a voltage difference across the first signal input terminal and the second signal input terminal. The delay time control circuit is coupled to the voltage drop generating circuit, is configured to enable the voltage drop generating circuit to generate the voltage difference when a first power voltage is within a predetermined voltage range, and is configured to calculate a delay time according to the voltage difference, where the isolation integrated circuit further includes a first power terminal, and the first power terminal is configured to receive the first power voltage. The signal delay circuit is coupled to the delay time control circuit, and is configured to delay one of the first input signal and the second input signal according to the delay time when the first power voltage is greater than an upper limit of the predetermined voltage range, to control a duty ratio of the output signal.

One aspect of this application is an isolation integrated circuit. The isolation integrated circuit includes a primary side circuit, an isolation circuit, a secondary side circuit, and a signal delay setting circuit. The primary side circuit is configured to receive a first power voltage via a first power terminal, receive a first input signal via a first signal input terminal, receive a second input signal via a second signal input terminal, and generate an intermediate signal according to the first input signal and the second input signal. The isolation circuit is coupled to the primary side circuit, and is configured to transmit the intermediate signal. The secondary side circuit is coupled to the isolation circuit, and is configured to receive the intermediate signal via the isolation circuit and output, via the signal output terminal, an output signal generated according to the intermediate signal. The signal delay setting circuit is coupled to the primary side circuit, is configured to calculate a delay time according to a voltage difference across the first signal input terminal and the second signal input terminal when the first power voltage is within a predetermined voltage range, and is configured to delay one of the first input signal and the second input signal according to the delay time when the first power voltage is greater than an upper limit of the predetermined voltage range, to control a duty ratio of the output signal.

One aspect of this application is a power conversion circuitry. The power conversion circuitry includes a high-side switch, a low-side switch, a controller circuit, a first isolation integrated circuit, and a second isolation integrated circuit. The controller circuit is configured to output a first input signal and a second input signal. The first isolation integrated circuit is coupled between the controller circuit and the high-side switch, includes a first signal delay setting circuit, and is configured to receive the first input signal via a first signal input terminal, receive the second input signal via a second signal input terminal, and generate a first output signal for driving the high-side switch according to the first input signal and the second input signal. The second isolation integrated circuit is coupled to the controller circuit and the low-side switch, includes a second signal delay setting circuit, and is configured to receive the second input signal via a third signal input terminal, receive the first input signal via a fourth signal input terminal, and generate a second output signal for driving the low-side switch according to the first input signal and the second input signal. When a first power voltage is within a predetermined voltage range, the first signal delay setting circuit calculates a first delay time according to a first voltage difference across the first signal input terminal and the second signal input terminal, and the second signal delay setting circuit calculates a second delay time according to a second voltage difference across the third signal input terminal and the fourth signal input terminal. When the first power voltage is greater than an upper limit of the predetermined voltage range, the first signal delay setting circuit delays the second input signal according to the first delay time to control a duty ratio of the first output signal, and the second signal delay setting circuit delays the first input signal according to the second delay time to control a duty ratio of the second output signal, so that the high-side switch and the low-side switch are not turned on at the same time.

To sum up, by controlling, using the signal delay setting circuit, the duty ratio of the output signal generated by the isolation integrated circuit, the power conversion circuitry of this application can effectively generate a dead time to protect the high-side switch and the low-side switch. In addition, compared with some related art techniques that generate a dead time by using RC circuit settings or using trimming methods, the isolation integrated circuit and the power conversion circuitry of this application have the advantages of less deviated dead time, high reliability, low requirements for circuit area, and the like.

DETAILED DESCRIPTION

The following is detailed descriptions of embodiments with the attached drawings, but the specific embodiments described are only used to explain this application, and are not used to limit this application. Descriptions of structure operations is not used to limit an execution order, and any apparatuses with equivalent functions generated by the recombination of components are covered by the present invention.

Unless otherwise specified, the terms used in the whole specification and the patent application usually have the ordinary meaning of each term used in this field, in the content disclosed here and in special content.

As used herein, "coupled" or "connected" may mean that two or more components are in direct physical or electrical contact with each other, or indirectly in physical or electrical contact with each other, or that two or more components operate or act with each other.

Figure 1:
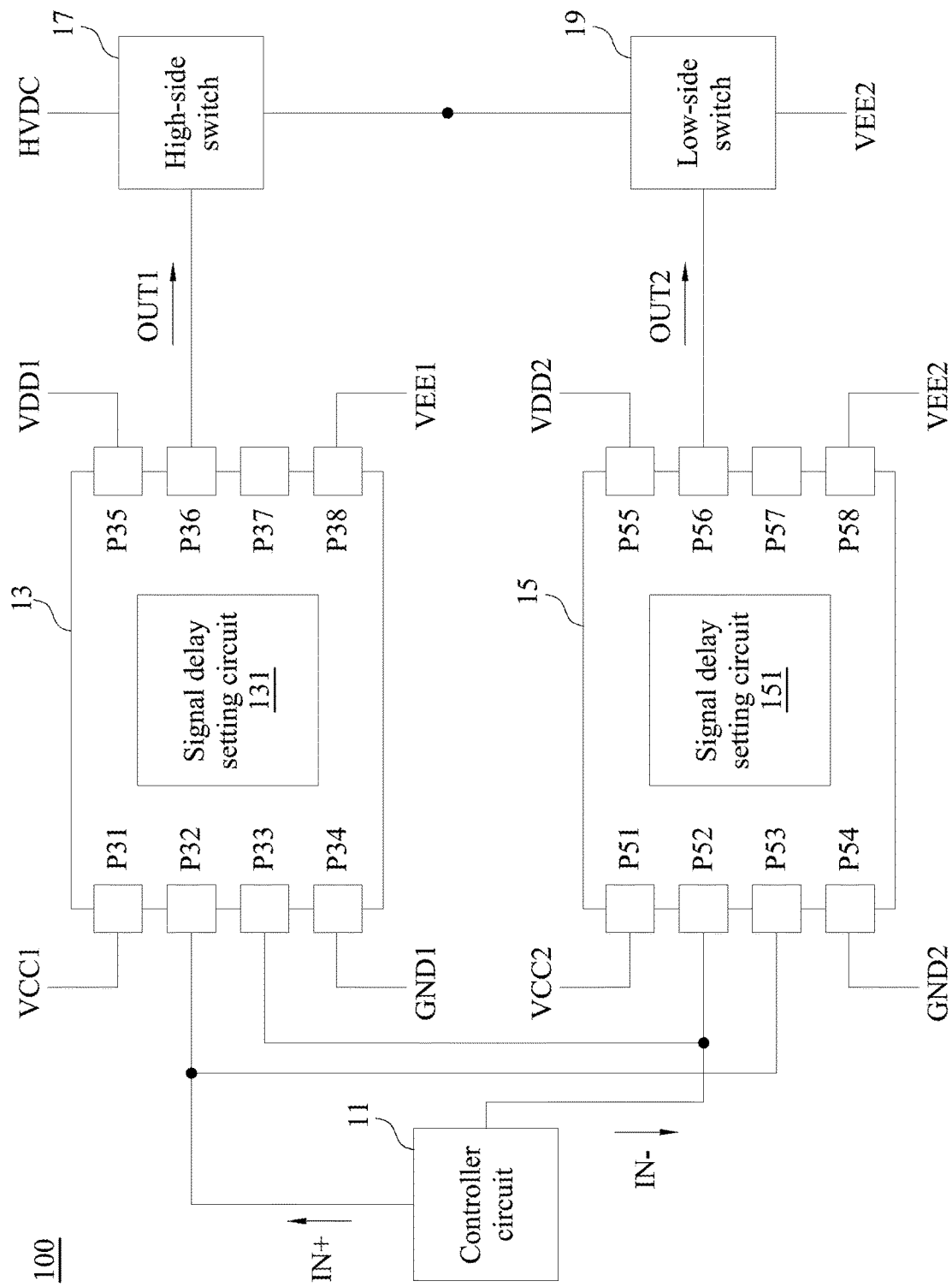
FIG. 1 is a circuit block diagram of a power conversion circuitry according to some embodiments of this application.

Refer to FIG. 1. FIG. 1 is a circuit block diagram of a power conversion circuitry 100 according to some embodiments of this application. In some embodiments, the power conversion circuitry 100 includes a controller circuit 11, an isolation integrated circuit 13, an isolation integrated circuit 15, a high-side switch 17 and a low-side switch 19. Specifically, the power conversion circuitry 100 may be, for example, but not limited to, a buck converter.

In some embodiments, as shown in FIG. 1, the controller circuit 11 is electrically coupled to the isolation integrated circuit 13 and the isolation integrated circuit 15. The isolation integrated circuit 13 is electrically coupled to the high-side switch 17, and the second isolation integrated circuit 15 is electrically coupled to the low-side switch 19. Further, the high-side switch 17 and the low-side switch 19 are connected in series. It should be understood that in some embodiments, a connection node (depicted as a dot in FIG. 1) between the high-side switch 17 and the low-side switch 19 may be electrically coupled to a load circuit (not shown).

According to a circuit architecture of the power conversion circuitry 100, in some embodiments, the controller circuit 11 is configured to output a first input signal IN+ and a second input signal IN− to both of the isolation integrated circuit 13 and the isolation integrated circuit 15, wherein the first input signal IN+ and the second input signal IN− can be out of phase. The isolation integrated circuit 13 is configured to generate an output signal OUT1 to the high-side switch 17 according to the first input signal IN+ and the second input signal IN−. The isolation integrated circuit 15 is configured to generate an output signal OUT2 to the low-side switch 19 according to the first input signal IN+ and the second input signal IN−. Driven by the output signals OUT1 and OUT2, the high-side switch 17 and the low-side switch 19 may be turned on alternately to generate an output current (not shown) flowing through the load circuit. In some embodiments, the first input signal IN+, the second input signal IN−, the output signal OUT1, and the output signal OUT2 are all periodic signals. In addition, the output signal OUT1 and the output signal OUT2 are substantially out of phase, so that the high-side switch 17 and the low-side switch 19 may be driven to be turned on alternately.

In some embodiments, the isolation integrated circuit 13 includes a first power terminal P31, a first signal input terminal P32, a second signal input terminal P33, a first ground terminal P34, a second power terminal P35, a signal output terminal P36, an output/clamp terminal P37, and a second ground terminal P38. As shown in FIG. 1, the isolation integrated circuit 13 receives a first power voltage VCC1 via the first power terminal P31, receives the first input signal IN+ via the first signal input terminal P32, receives the second input signal IN− via the second signal input terminal P33, receives a first ground voltage GND1 via the first ground terminal P34, receives a second power voltage VDD1 via the second power terminal P35, outputs the output signal OUT1 via the signal output terminal P36, and receives a second ground voltage VEE1 via the second ground terminal P38.

In some further embodiments, the output/clamp terminal P37 may be electrically coupled to the high-side switch 17, and the isolation integrated circuit 13 outputs a first level output signal (not shown) to the high-side switch 17 via the signal output terminal P36, or outputs a second level output signal (not shown) to the high-side switch 17 via the output/clamp terminal P37, as the output signal OUT1, that is, the signal output terminal P36 and the output/clamp terminal P37 are jointly configured to control the high-side switch 17, wherein the first level output signal may have a low logic level, and the second level output signal may have a high logic level. In some other further embodiments, the isolation integrated circuit 13 outputs the first level output signal or the second level output signal to the high-side switch 17 via the signal output terminal P36 to control an on-state of the high-side switch 17, and the output/clamp terminal P37 is electrically coupled to an external component (not shown) to perform a clamping operation when the high-side switch 17 is turned off.

In some embodiments, the isolation integrated circuit 15 includes a first power terminal P51, a first signal input terminal P52, a second signal input terminal P53, a first ground terminal P54, a second power terminal P55, a signal output terminal P56, an output/clamp terminal P57, and a second ground terminal P58. As shown in FIG. 1, the isolation integrated circuit 15 receives a first power voltage VCC2 via the first power terminal P51, receives the second input signal IN− via the first signal input terminal P52, receives the first input signal IN+ via the second signal input terminal P53, receives a first ground voltage GND2 via the first ground terminal P54, receives a second power voltage VDD2 via the second power terminal P55, outputs the output signal OUT2 via the signal output terminal P56, and receives a second ground voltage VEE2 via the second ground terminal P58.

In some further embodiments, the output/clamp terminal P57 may be electrically coupled to the low-side switch 19, and the isolation integrated circuit 15 outputs a first level output signal (not shown) to the low-side switch 19 via the signal output terminal P56, or outputs a second level output signal (not shown) to the low-side switch 19 via the output/clamp terminal P57, as the output signal OUT2, that is, the signal output terminal P56 and the output/clamp terminal P57 are jointly configured to control the low-side switch 19, wherein the first level output signal may have a low logic level, and the second level output signal may have a high logic level. In some other further embodiments, the isolation integrated circuit 15 outputs the first level output signal or the second level output signal to the low-side switch 19 via the signal output terminal P56 to control an on-state of the low-side switch 19, and the output/clamp terminal P57 is electrically coupled to an external component (not shown) to perform a clamping operation when the low-side switch 19 is turned off.

In the above embodiment, as shown in FIG. 1, the high-side switch 17 is coupled to a third power voltage HVDC, and the low-side switch 19 is coupled to the second ground voltage VEE2. To be specific, the high-side switch 17 and the low-side switch 19 are connected in series between the third power voltage HVDC and the second ground voltage VEE2. In the above embodiment, the first power voltage VCC1, the first power voltage VCC2, the second power voltage VDD1, the second power voltage VDD2, and the third power voltage HVDC are different from one another, and the first ground voltage GND1, the first ground voltage GND2, the second ground voltage VEE1, and the second ground voltage VEE2 are different from one another, but the present invention is not limited thereto.

Generally speaking, the high-side switch 17 and the low-side switch 19 may each be implemented using transistors (for example, metal oxide semiconductor (MOS) transistors). Therefore, if the high-side switch 17 and the low-side switch 19 are turned on at the same time due to some non-ideal factors, a large current may flow through the high-side switch 17 and the low-side switch 19, which further causes the high-side switch 17 and the low-side switch 19 or transistors in the high-side switch 17 and the low-side switch 19 to burn out.

In view of this, in some embodiments, the isolation integrated circuit 13 is configured with a signal delay setting circuit 131, and the isolation integrated circuit 15 is configured with a signal delay setting circuit 151. It is worth noting that the signal delay setting circuit 131 and the signal delay setting circuit 151 are configured to control a duty ratio of the output signal OUT1 and a duty ratio of the output signal OUT2, respectively, so as to ensure that the high-side switch 17 and the low-side switch 19 cannot be turned on at the same time.

Figure 2:
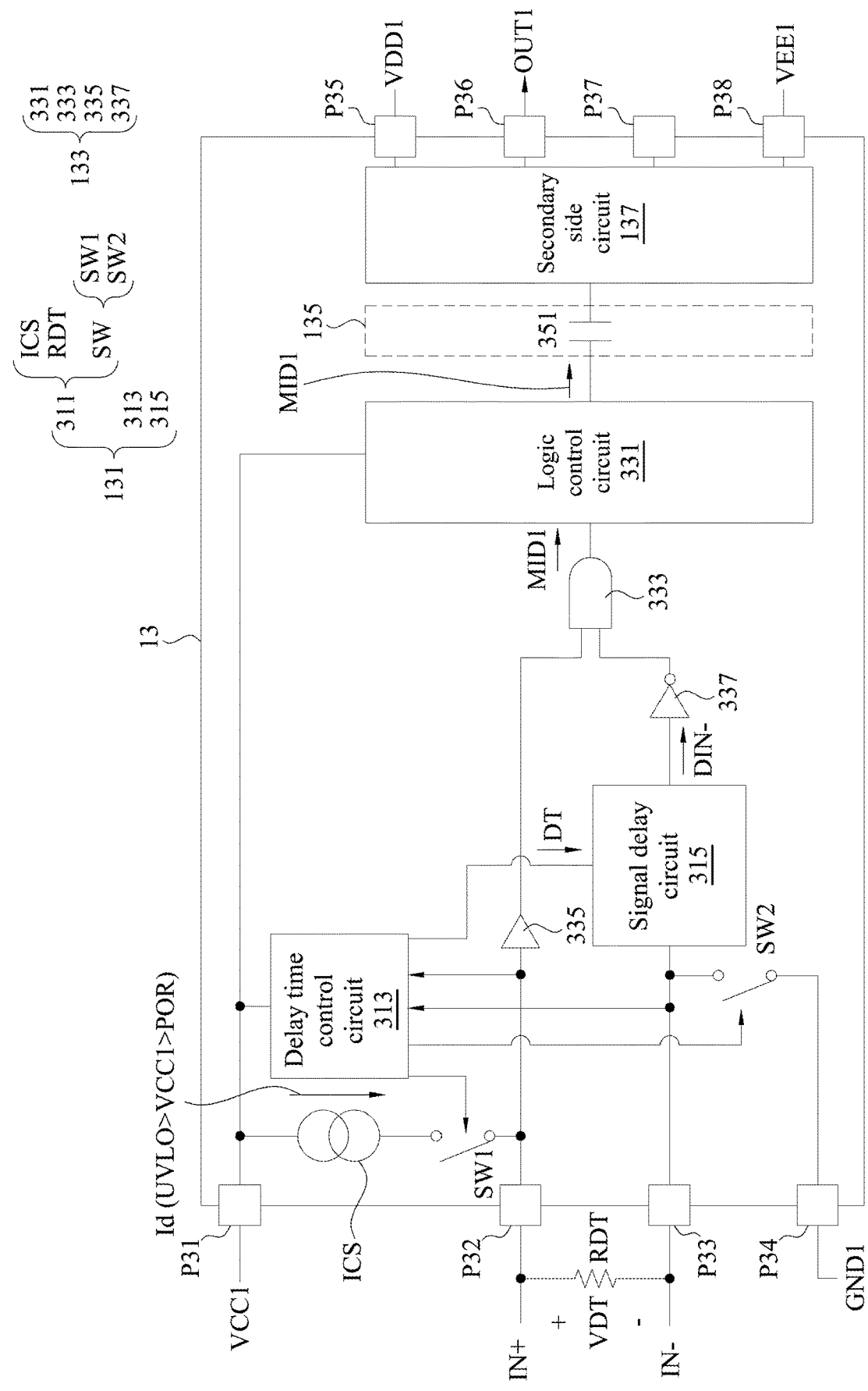
FIG. 2 is a schematic circuit diagram of an isolation integrated circuit according to some embodiments of this application.

Next, the isolation integrated circuit 13 will be described in detail with reference to FIG. 2. FIG. 2 is a schematic circuit diagram of the isolation integrated circuit 13 according to some embodiments of this application. In some embodiments, the isolation integrated circuit 13 includes the signal delay setting circuit 131, a primary side circuit 133, an isolation circuit 135, and a secondary side circuit 137. Specifically, the isolation integrated circuit 13 may be, for example, but not limited to, a gate driver. That is, in some embodiments, the output signal OUT1 is output to a gate of a transistor of the high-side switch 17.

In some embodiments, the signal delay setting circuit 131 includes a voltage drop generating circuit 311, a delay time control circuit 313, and a signal delay circuit 315. In some further embodiments, the voltage drop generating circuit 311 includes a current generating circuit ICS, a resistor component RDT, and a switch circuit SW, wherein the switch circuit SW includes a first switch SW1 and a second switch SW2. Specifically, the current generating circuit ICS may be implemented by a current source (such as a current mirror circuit), the resistor component RDT may be implemented by a resistor, and the first switch SW1 and the second switch SW2 may be implemented by transistors. It should be understood that in some alternative embodiments, the resistor component RDT may be replaced by another suitable passive component (such as a capacitor, an inductor, etc.).

In some embodiments, the primary side circuit 133 includes a logic control circuit 331, a logic circuit 333, a logic circuit 335, and a logic circuit 337. Specifically, the logic control circuit 331 may be implemented with an oscillator, a modulator, a transmitter, or a combination thereof, the logic circuit 333 may be implemented with an AND gate, the logic circuit 335 may be implemented with a buffer gate, and the logic circuit 337 may be implemented with a NOT gate.

In some embodiments, the logic circuit 335 is coupled between the first signal input terminal P32 and a first data input terminal of the logic circuit 333. The signal delay circuit 315 is coupled between the second signal input terminal P33 and a data input terminal of the logic circuit 337, and the logic circuit 337 is coupled between the signal delay circuit 315 and a second data input terminal of the logic circuit 333. Further, a data output terminal of the logic circuit 333 is coupled to a data input terminal of the logic control circuit 331.

In some embodiments, the current generating circuit ICS is coupled between the first power terminal P31 and the first switch SW1. The first switch SW1 is coupled between the current generating circuit ICS and the first signal input terminal P32. The resistor component RDT is coupled between the first signal input terminal P32 and the second signal input terminal P33. The second switch SW2 is coupled between the second signal input terminal P33 and the first ground terminal P34.

In some embodiments, the delay time control circuit 313 is coupled to the first power terminal P31, the logic control circuit 331, the signal delay circuit 315, the first signal input terminal P32, the second signal input terminal P33, the first switch SW1, and the second switch SW2.

As can be seen from the descriptions of the signal delay setting circuit 131 and the primary side circuit 133, the signal delay setting circuit 131 is coupled to the primary side circuit 133. In addition, in some further embodiments, as shown in FIG. 2, the resistor component RDT in the signal delay setting circuit 131 is arranged outside the isolation integrated circuit 13, and the current generating circuit ICS, the first switch SW1, and the second switch SW2 in the signal delay setting circuit 131 are arranged inside the isolation integrated circuit 13. However, the present invention is not limited to the above, and any circuit that can generate a voltage difference VDT across the first signal input terminal P32 and the second signal input terminal P33 within a specific period can be configured to implement the signal delay setting circuit 131.

In some embodiments, one terminal of the isolation circuit 135 is coupled to an output terminal of the primary side circuit 133 (i.e., a data output terminal of the logic control circuit 331), and the other terminal of the isolation circuit 135 is coupled to an input terminal of the secondary side circuit 137, so as to provide electrical insulation between the primary side circuit 133 and the secondary side circuit 137 in the isolation integrated circuit 13 according to system requirements. Accordingly, operating voltages of the primary side circuit 133 (i.e., the first power voltage VCC1 and the first ground voltage GND1) are different from those of the secondary side circuit 137 (i.e., the second power voltage VDD1 and the second ground voltage VEE1). Specifically, the isolation circuit 135 may be implemented with a passive component (e.g., a capacitor 351) or an insulating component (e.g., a transformer).

In some embodiments, the isolation circuit 135 is further used as a communication interface between the primary side circuit 133 and the secondary side circuit 137 while ensuring voltage isolation (i.e., the aforementioned electrical insulation) between the primary side circuit 133 and the secondary side circuit 137, so that data, signals and/or information can be transmitted from the primary side circuit 133 to the secondary side circuit 137 (for example, through a voltage coupling phenomenon). In addition, in some embodiments, the secondary side circuit 137 may be implemented with a demodulator, a receiver, an amplifier, or a combination thereof.

In some embodiments, the first power voltage VCC1 starts to rise from 0 volts. After the first power voltage VCC1 rises to a power-on reset voltage POR (for example, 1.2 to 1.8 volts), the isolation integrated circuit 13 will be initialized to a default state to facilitate logic operations in the isolation integrated circuit 13. Then, after the first power voltage VCC1 continuously rises to an undervoltage lockout voltage UVLO (for example, 3, 5, and 8 volts), the isolation integrated circuit 13 immediately operates according to the first input signal IN+ and the second input signal IN−.

In some embodiments, the delay time control circuit 313 is configured to detect the first power voltage VCC1. When it is detected that the first power voltage VCC1 is greater than the power-on reset voltage POR and less than the undervoltage locking voltage UVLO, the delay time control circuit 313 controls the first switch SW1 and the second switch SW2 to be turned on. Accordingly, a current path is formed between the first power voltage VCC1 and the first ground voltage GND1. Specifically, the current path passes through the first power terminal P31, the current generating circuit ICS, the first switch SW1, the resistor component RDT, the second switch SW2 and the first ground terminal P34.

In some embodiments, the current generating circuit ICS is configured to generate a detection current Id according to the first power voltage VCC1, where the detection current Id may be a fixed current. Through the current path, the detection current Id generated by the current generating circuit ICS may sequentially flow through the first power terminal P31, the current generating circuit ICS, the first switch SW1, the resistor component RDT, and the second switch SW2, and to the first ground terminal P34. According to the Ohm's law, when the detection current Id flows through the resistor component RDT, a voltage difference VDT will be generated across two terminals of the resistor component RDT (namely, the first signal input terminal P32 and the second signal input terminal P33). In some embodiments, the delay time control circuit 313 is configured to calculate a delay time DT according to the voltage difference VDT, which will be described in detail in the following paragraphs with reference to FIG. 3.

Figure 3:
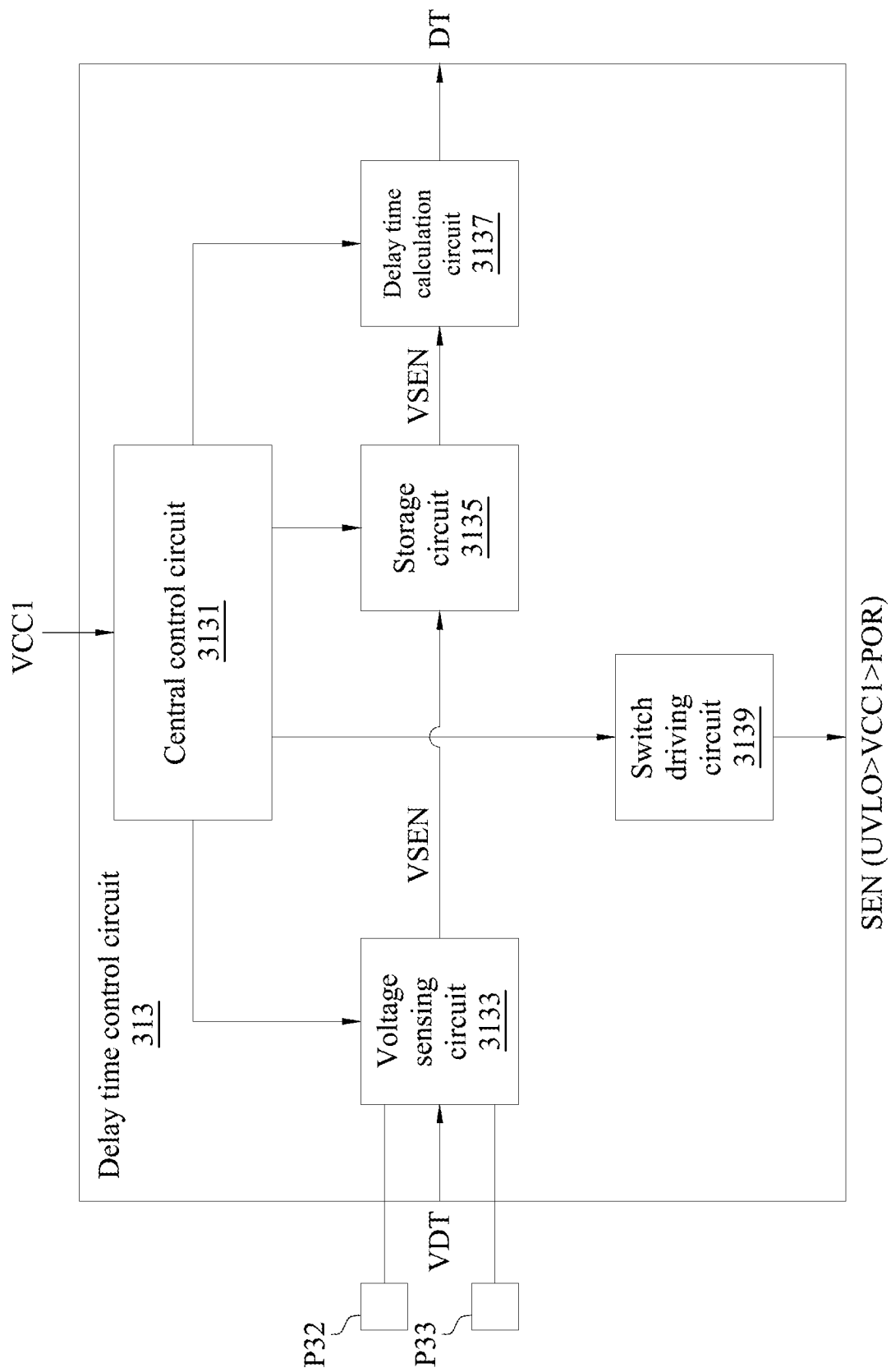
FIG. 3 is a circuit block diagram of a delay time control circuit according to some embodiments of this application.

Refer to FIG. 3. FIG. 3 is a circuit block diagram of the delay time control circuit 313 according to some embodiments of this application. In some embodiments, the delay time control circuit 313 includes a central control circuit 3131, a voltage sensing circuit 3133, a storage circuit 3135, a delay time calculation circuit 3137, and a switch driving circuit 3139. As shown in FIG. 3, the voltage sensing circuit 3133 is coupled to the first signal input terminal P32 and the second signal input terminal P33. The storage circuit 3135 is coupled to the voltage sensing circuit 3133, and the delay time calculation circuit 3137 is coupled to the storage circuit 3135. The central control circuit 3131 is coupled to the voltage sensing circuit 3133, the storage circuit 3135, the delay time calculation circuit 3137, and the switch driving circuit 3139.

In some embodiments, the central control circuit 3131 is configured to detect the first power voltage VCC1 and control operation of the voltage sensing circuit 3133, the storage circuit 3135, the delay time calculation circuit 3137, and the switch driving circuit 3139.

In some embodiments, the voltage sensing circuit 3133 senses the voltage difference VDT across the first signal input terminal P32 and the second signal input terminal P33 to output a sensed voltage value VSEN corresponding to the voltage difference VDT. In some embodiments, the sensed voltage value VSEN is a value of the current value (for example, 0.1 to 100 microamperes (μA)) of the detection current Id multiplying the resistance value (for example, 1 kiloohm to 500 kiloohms (kΩ)) of the resistor component RDT.

In some embodiments, the storage circuit 3135 is configured to store the sensed voltage value VSEN to provide the sensed voltage value VSEN to the delay time calculation circuit 3137. Specifically, the storage circuit 3135 may be implemented by one or more memories.

In some embodiments, the delay time calculation circuit 3137 is configured to calculate the delay time DT according to the sensed voltage value VSEN. In some further embodiments, a look-up table (not shown) is pre-stored in the storage circuit 3135, and records a plurality of voltage values and a plurality of corresponding time lengths. Therefore, the delay time calculation circuit 3137 may compare a plurality of voltage values in the lookup table with the sensed voltage value VSEN, to search for a voltage value of the plurality of voltage values that is the same as the sensed voltage value VSEN, and take a time length corresponding to said voltage value as the delay time DT. It should be understood that when a voltage value that is the same as the sensed voltage value VSEN is not found from the plurality of voltage values, the delay time calculation circuit 3137 may further calculate the delay time DT by, for example, but not limited to, interpolation.

The way of calculating the delay time DT is not limited to the above. For example, in some embodiments, the delay time calculation circuit 3137 calculates the delay time DT by substituting the sensed voltage value VSEN into the following formula (1), where a and b may each be any preset value. It should be understood that the delay time calculation circuit 3137 is not limited to using the formula (1) to calculate the delay time DT, and any formula that can represent the relationship between the sensed voltage value VSEN and the delay time DT can be used by the delay time calculation circuit 3137 to calculate the delay time DT.

$$DT = a \times VSEN + b \qquad (1)$$

Following the above embodiment in which the delay time control circuit 313 controls the first switch SW1 and the second switch SW2 to be turned on, the delay time control circuit 313 may control the first switch SW1 and the second switch SW2 to be turned on or off through the switch driving circuit 3139 in FIG. 3. For example, when the central control circuit 3131 detects that the first power voltage VCC1 is greater than the power-on reset voltage POR and less than the undervoltage lockout voltage UVLO, the central control circuit 3131 controls the switch driving circuit 3139 to output an enable signal SEN to the first switch SW1 and the second switch SW2 to control the first switch SW1 and the second switch SW2 to be turned on.

In some embodiments, when it is detected that the first power voltage VCC1 is neither greater than the power-on reset voltage POR nor less than the undervoltage lockout voltage UVLO, the delay time control circuit 313 controls the first switch SW1 and the second switch SW2 to be turned off through the switch driving circuit 3139. Accordingly, the detection current Id will not flow through the resistor component RDT.

As can be seen from the descriptions of FIGS. 2 and 3, the delay time control circuit 313 is configured to enable the voltage drop generating circuit 311 (that is, to turn on the first switch SW1 and the second switch SW2) to generate the voltage difference VDT across the first signal input terminal P32 and the second signal input terminal P33 when the first power voltage VCC1 is within a predetermined voltage range (that is, between the power-on reset voltage POR and the undervoltage lockout voltage UVLO). In addition, the delay time control circuit 313 may calculate the delay time DT according to the voltage difference VDT by using a look-up table or through formula calculation.

In some embodiments, after the delay time DT is calculated by the delay time calculation circuit 3137, the delay time control circuit 313 provides the delay time DT to the signal delay circuit 315 as shown in FIG. 2.

In some embodiments, as described above, the delay time control circuit 313 disables the voltage drop generating circuit 311 (e.g., by turning off the first switch SW1 and the second switch SW2) when it is detected that the first power voltage VCC1 continuously rises to exceeding the undervoltage lockout voltage UVLO. Accordingly, the isolation integrated circuit 13 may operate according to the first input signal IN+ and the second input signal IN−, and the signal delay circuit 315 may delay, according to the delay time DT, the signals received by the signal delay circuit 315.

Figure 4:
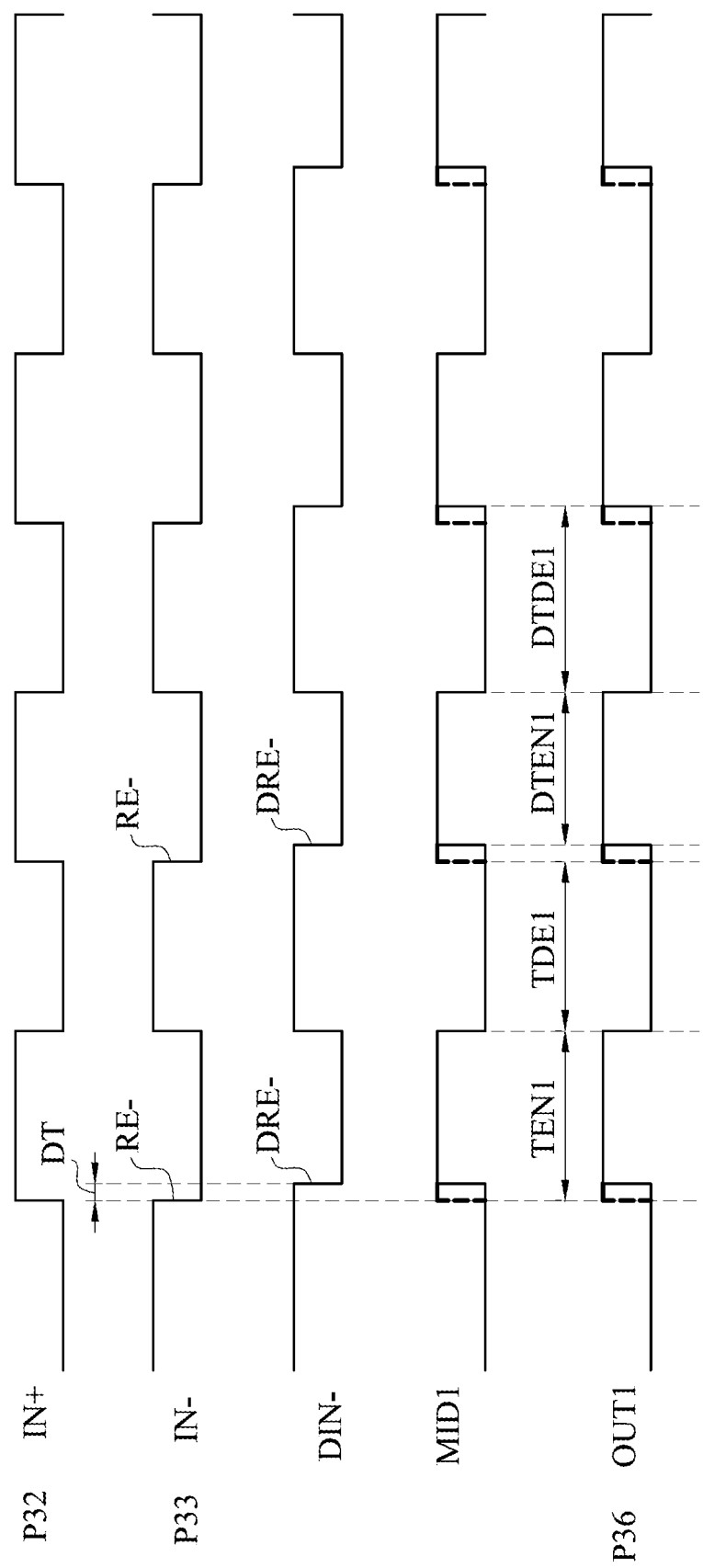
FIG. 4 is a signal timing diagram of an isolation integrated circuit according to some embodiments of this application.

Next, operation of the isolation integrated circuit 13 according to the first input signal IN+ and the second input signal IN− will be described with reference to FIGS. 2 and 4, where FIG. 4 is a timing diagram of some signals related to the isolation integrated circuit 13 according to some embodiments of this application.

In some embodiments, as shown in FIG. 2, the primary side circuit 133 receives the first input signal IN+ from the first signal input terminal P32 via the logic circuit 335.

In some embodiments, as shown in FIG. 2, the signal delay circuit 315 receives the second input signal IN− from the second signal input terminal P33 and delays the second input signal IN− according to the delay time DT to output the delayed input signal DIN− to the logic circuit 337. In some further embodiments, as shown in FIG. 4, the signal delay circuit 315 delays a falling edge RE− of the second input signal IN− according to the delay time DT to generate the delayed input signal DIN−. Therefore, in FIG. 4, a falling edge DRE− of the delayed input signal DIN− will lag the falling edge RE− of the second input signal IN− by about the delay time DT. In this embodiment, the signal delay circuit 315 may be a digital circuit to delay only the falling edge RE− of the second input signal IN−, but the present invention is not limited to this. In addition, although the signal delay circuit 315 is arranged on a transmission path of the second input signal IN− in this embodiment, in some variations of the present invention, the same effect can be achieved while the signal delay circuit 315 is arranged on a transmission path of the first input signal IN+ instead.

In the embodiment of FIG. 2, the logic circuit 335 buffers the first input signal IN+ and transmits it to the logic circuit 333, and the logic circuit 337 inverts the delayed input signal DIN− and transmits it to the logic circuit 333. Thereafter, the logic circuit 333 generates an intermediate signal MID1 to the logic control circuit 331 according to the first input signal IN+ and the delayed input signal DIN−, and the logic control circuit 331 may appropriately process the intermediate signal MID1 (e.g., by conducting signal buffering, signal amplification, etc.) and then couple it to the isolation circuit 135.

In some embodiments, as shown in FIG. 2, the isolation circuit 135 is configured to couple and transmit the intermediate signal MID1 from the primary side circuit 133 to the secondary side circuit 137, so that the secondary side circuit 137 may generate the output signal OUT1 according to the intermediate signal MID1. In some further embodiments, the secondary side circuit 137 receives and appropriately processes (e.g., by conducting signal buffering, signal amplification, etc.) a signal substantially the same as the intermediate signal MID1 to generate the output signal OUT1. Therefore, in some embodiments, as shown in FIG. 4, a waveform of the output signal OUT1 and a waveform of the intermediate signal MID1 have substantially the same frequency and/or cycle.

Next, the output signal OUT1 will be further explained with reference to FIG. 4. With the circuit architecture of FIG. 2, each cycle of the output signal OUT1 has an enable period DTEN1 (which corresponds to the output signal OUT1 at an enable level) and a disable period DTDE1 (which corresponds to the output signal OUT1 at a disable level).

In addition, FIG. 4 also shows a rising edge of the output signal OUT1 (indicated by a thick dotted line) when the isolation integrated circuit 13 does not delay the second input signal IN− in the primary side circuit 133. In this case, each cycle of signals output by the isolation integrated circuit 13 has an enable period TEN1 and a disable period TDE1. As can be seen from FIG. 4, compared with the output signal OUT1 generated without delaying the second input signal IN− in the primary side circuit 133, the output signal OUT1 generated using the circuit architecture of FIG. 2 has a lower duty ratio (namely, a proportion of an enable period DTEN1 in one cycle of the output signal OUT1). The aforementioned lower duty ratio may prevent the high-side switch 17 and the low-side switch 19 from being turned on at the same time. This effect will be described in detail in the following paragraphs with reference to FIG. 6.

Figure 5:
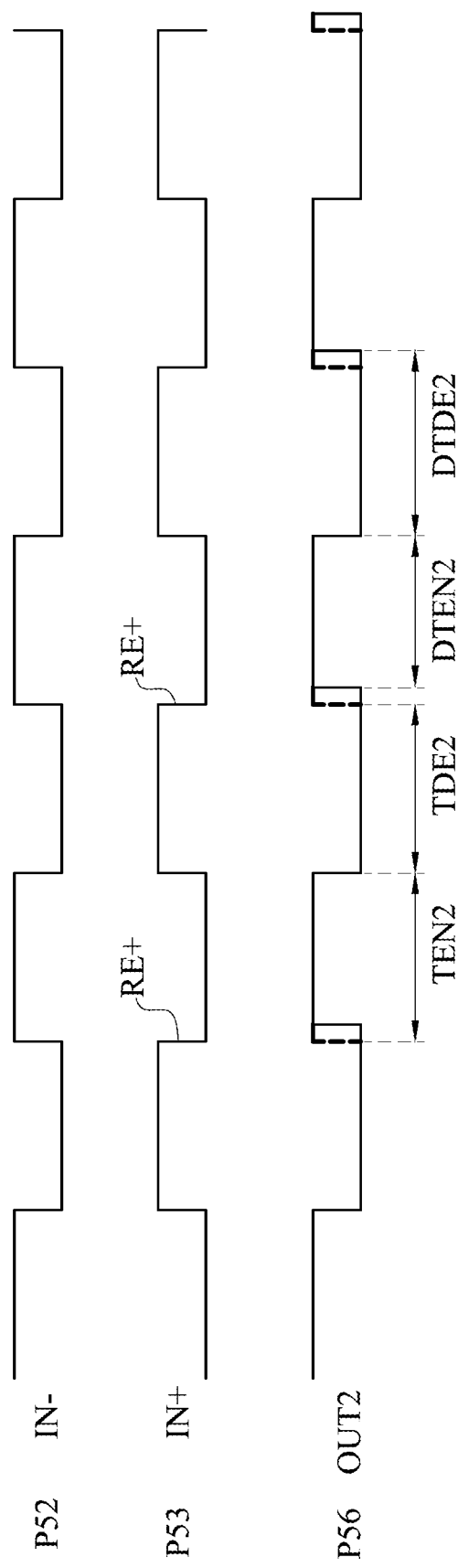
FIG. 5 is a signal timing diagram of an isolation integrated circuit according to some embodiments of this application.

Refer to FIG. 5. FIG. 5 is a timing diagram of some signals related to the isolation integrated circuit 15 according to some embodiments of this application. It should be understood that the isolation integrated circuit 15 in FIG. 1 may adopt the same or similar circuit architecture as the isolation integrated circuit 13 in FIG. 2, so that the detailed descriptions of the isolation integrated circuit 15 is omitted here.

As shown in FIG. 5, a main difference between the isolation integrated circuit 15 and the isolation integrated circuit 13 is that the isolation integrated circuit 15 receives the second input signal IN− via the first signal input terminal P52, and receives the first input signal IN+ via the second signal input terminal P53. In other words, in some embodiments, the signal delay setting circuit 151 in the isolation integrated circuit 15 delays a falling edge RE+ of the first input signal IN+ to generate the output signal OUT2. Similar to the output signal OUT1, each cycle of the output signal OUT2 has an enable period DTEN2 (which corresponds to the output signal OUT2 at an enable level) and a disable period DTDE2 (which corresponds to the output signal OUT2 at a disable level).

In addition, FIG. 5 also shows a rising edge of the output signal OUT2 (indicated by a thick dotted line) when the isolation integrated circuit 15 does not delay the first input signal IN+ in the primary side circuit. In this case, each cycle of signals output by the isolation integrated circuit 15 has an enable period TEN2 and a disable period TDE2. As can be seen from FIG. 5, compared with the output signal OUT2 generated without delaying the first input signal IN+ in the primary side circuit of the isolation integrated circuit 15, the output signal OUT2 generated by delaying the first input signal IN+ in the primary side circuit of the isolation integrated circuit 15 has a lower duty ratio (namely, a proportion of an enable period DTEN2 in one cycle of the output signal OUT2). The aforementioned lower duty ratio may prevent the high-side switch 17 and the low-side switch 19 from being turned on at the same time. This effect will be described in detail in the following paragraphs with reference to FIG. 6.

In the above embodiments, the high-side switch 17 in FIG. 1 is turned on according to the output signal OUT1 at the enable level (corresponding to the level in the enable period DTEN1 in FIG. 4) and turned off according to the output signal OUT1 at the disable level (corresponding to the level in the disable period DTDE1 in FIG. 4). The low-side switch 19 in FIG. 1 is turned on according to the output signal OUT2 at the enable level (corresponding to the level in the enable period DTEN2 in FIG. 5) and turned off according to the output signal OUT2 at the disable level (corresponding to the level in the disable period DTDE2 in FIG. 5).

Figure 6:
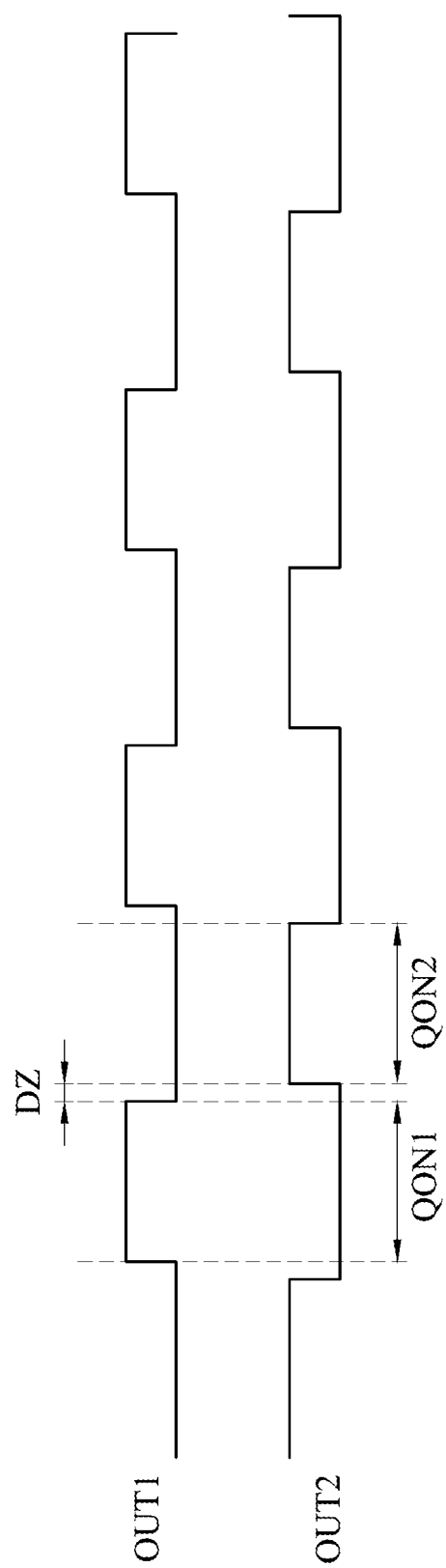
FIG. 6 is a timing diagram of output signals of two isolation integrated circuits according to some embodiments of this application.

Then, the relationship between the output signal OUT1 and the output signal OUT2 is further explained with reference to FIG. 6. FIG. 6 is a timing diagram of the output signal OUT1 and the output signal OUT2 according to some embodiments of this application. As can be seen from the above descriptions, the signal delay setting circuit 131 controls the isolation integrated circuit 13 to generate an output signal OUT1 with a lower duty ratio, and the signal delay setting circuit 151 controls the isolation integrated circuit 15 to generate an output signal OUT2 with a lower duty ratio. Accordingly, as shown in FIG. 6, the high-side switch 17 is turned on in a period QON1 (corresponding to the enable period DTEN1 of the output signal OUT1), and the low-side switch 19 is turned on in a period QON2 (corresponding to the enable period DTEN2 of the output signal OUT2). As the period QON1 and the period QON2 do not overlap, the high-side switch 17 and the low-side switch 19 will not be turned on at the same time. A period DZ between the period QON1 and the period QON2 is generally called a dead zone or dead time.

In the above embodiments, as shown in FIG. 2, the logic circuit 337 is coupled between the signal delay circuit 315 and the logic circuit 333, but the present invention is not limited to this. For example, in some embodiments, the logic circuit 337 is coupled between the second signal input terminal P33 and the signal delay circuit 315. Under this configuration, the logic circuit 337 inverts the second input signal IN− and transmits the inverted second input signal IN− to the signal delay circuit 315. The signal delay circuit 315 then delays a plurality of rising edges of the inverted second input signal IN− according to the delay time DT, so that the output signal OUT1 shown in FIG. 4 may also be generated.

In the above embodiments, as shown in FIG. 2, the signal delay circuit 315 is configured to delay the second input signal IN− from the second signal input terminal P33, but the present invention is not limited to this. For example, in some embodiments, the signal delay circuit 315 may alternatively be connected in series with the logic circuit 335 on the input end or output end of the logic circuit 335, and delay a plurality of rising edges of the first input signal IN+ from the first signal input terminal P32 according to the delay time DT, and the second input signal IN− from the second signal input terminal P33 is directly transmitted to the logic circuit 337, as an alternative of generating the output signal OUT1 shown in FIG. 4.

As can be seen from the above descriptions, the signal delay circuit 315 of this application may delay one of the first input signal IN+ and the second input signal IN− according to the delay time DT when the first power voltage VCC1 is greater than the upper limit of the predetermined voltage range (e.g., the undervoltage lockout voltage UVLO), so as to control the duty ratio of the output signal OUT1. It should be understood that the above descriptions are also applicable to the signal delay setting circuit 151 in the isolation integrated circuit 15, that is, the signal delay setting circuit 151 may delay one of the first input signal IN+ and the second input signal IN− according to the delay time DT to control the duty ratio of the output signal OUT2. Since the signal delay setting circuit 151 may be configured with reference to the signal delay setting circuit 131, other details about the signal delay setting circuit 151 are omitted here.

In the above embodiments, as shown in FIG. 2, the logic control circuit 331 appropriately processes the intermediate signal MID1 (e.g., signal buffering, signal amplification, etc.) and then couples it to the isolation circuit 135. In some further embodiments, the logic control circuit 331 modulates, through a modulator, the intermediate signal MID1 according to a fundamental frequency signal provided by an oscillator to generate a modulated signal. The isolation circuit 135 couples the modulated signal to the secondary side circuit 137. The secondary side circuit 137 demodulates the modulated signal through a demodulator to generate a signal substantially the same as the intermediate signal MID1.

In addition, the delay time control circuit 313 of this application is not limited to the circuit architecture shown in FIG. 3. For example, in some embodiments, the central control circuit 3131 may receive and store the sensed voltage value VSEN through its internal storage circuit (not shown), so as to provide the sensed voltage value VSEN to the delay time calculation circuit 3137. In these embodiments, the storage circuit 3135 may be omitted from FIG. 3.

It can be seen from the embodiments of this application that the duty ratio of the output signal OUT1 generated by the isolation integrated circuit 13 and the duty ratio of the output signal OUT2 generated by the isolation integrated circuit 15 are controlled by the signal delay setting circuit 131 and the signal delay setting circuit 151, respectively, so that the power conversion circuitry 100 of this application may effectively generate a dead time to prevent the high-side switch 17 and the low-side switch 19 from being turned on at the same time, thus achieving the effect of protecting the high-side switch 17 and the low-side switch 19. In addition, compared with some related art techniques that generate a dead time by using RC circuit settings or using trimming methods, the isolation integrated circuit 13, the isolation integrated circuit 15, and the power conversion circuitry 100 of this application have the advantages of less deviated dead time, high reliability, low requirements for circuit area, and the like.

Although the present invention has been disclosed in the above embodiments, they are not intended to limit the scope of the invention. Those of ordinary skills in the art can make various changes and modifications without departing from the spirit and scope of the present invention, so that the protection scope of the present invention should be determined by the appended claims.

What is claimed is:

1. A signal delay setting circuit, applicable to an isolation integrated circuit, wherein the isolation integrated circuit comprises a first signal input terminal, a second signal input terminal, and a signal output terminal, the first signal input terminal is configured to receive a first input signal, the second signal input terminal is configured to receive a second input signal, the signal output terminal is configured to output an output signal generated according to the first input signal and the second input signal, and the signal delay setting circuit comprises:
   a voltage drop generating circuit, configured to generate a voltage difference across the first signal input terminal and the second signal input terminal;
   a delay time control circuit, coupled to the voltage drop generating circuit, and configured to enable the voltage drop generating circuit to generate the voltage difference when a first power voltage is within a predetermined voltage range, and configured to obtain a delay time according to the voltage difference, wherein the isolation integrated circuit further comprises a first power terminal, and the first power terminal is configured to receive the first power voltage; and
   a signal delay circuit, coupled to the delay time control circuit, and configured to delay one of the first input signal and the second input signal according to the delay time when the first power voltage is greater than an upper limit of the predetermined voltage range, to control a duty ratio of the output signal.

2. The signal delay setting circuit according to claim 1, wherein the voltage drop generating circuit comprises:
   a current generating circuit, coupled to the first power terminal and configured to output a detection current;
   a resistor component, coupled between the first signal input terminal and the second signal input terminal; and
   a switch circuit, coupled to the current generating circuit, the resistor component, and a first ground voltage, and configured to be turned on when the delay time control circuit enables the voltage drop generating circuit, to allow the detection current to flow through the resistor component, so that the voltage difference is generated across both ends of the resistor component.

3. The signal delay setting circuit according to claim 2, wherein the resistor component is arranged outside the isolation integrated circuit, and the current generating circuit and the switch circuit are arranged inside the isolation integrated circuit.

4. The signal delay setting circuit according to claim 2, wherein the switch circuit comprises:
   a first switch, coupled between the current generating circuit and the first signal input terminal; and
   a second switch, coupled between the second signal input terminal and a first ground terminal of the isolation integrated circuit, wherein the first ground terminal is configured to receive the first ground voltage.

5. The signal delay setting circuit according to claim 1, wherein the delay time control circuit comprises:
   a voltage sensing circuit, configured to sense the voltage difference across the first signal input terminal and the second signal input terminal to output a sensed voltage value corresponding to the voltage difference;
   a delay time calculation circuit, configured to calculate the delay time according to the sensed voltage value to output the delay time to the signal delay circuit;
   a switch driving circuit, configured to control a switch circuit in the voltage drop generating circuit to be turned on or off; and
   a central control circuit, coupled to the voltage sensing circuit, the delay time calculation circuit, and the switch driving circuit, and configured to control the voltage sensing circuit, the delay time calculation circuit, and the switch driving circuit.

6. The signal delay setting circuit according to claim 5, wherein the delay time control circuit further comprises:
   a storage circuit, coupled to the voltage sensing circuit, the delay time calculation circuit, and the central control circuit, and configured to store the sensed voltage value to provide the sensed voltage value to the delay time calculation circuit.

7. The signal delay setting circuit according to claim 1, wherein the delay time control circuit calculates the delay time according to the voltage difference by using a look-up table or through formula calculation, and outputs the delay time to the signal delay circuit.

8. The signal delay setting circuit according to claim 1, wherein the signal delay circuit is coupled to the second signal input terminal and is configured to delay a plurality of falling edges of the second input signal or a plurality of rising edges of an inverted second input signal by the delay time.

9. The signal delay setting circuit according to claim 1, wherein the predetermined voltage range is between a power-on reset voltage and an undervoltage lockout voltage.

10. An isolation integrated circuit, having a first power terminal, a first signal input terminal, a second signal input terminal, and a signal output terminal, and comprising:
    a primary side circuit, configured to receive a first power voltage via the first power terminal, receive a first input signal via the first signal input terminal, receive a second input signal via the second signal input terminal, and generate an intermediate signal according to the first input signal and the second input signal;
    an isolation circuit, coupled to the primary side circuit, and configured to transmit the intermediate signal;
    a secondary side circuit, coupled to the isolation circuit, and configured to receive the intermediate signal via the isolation circuit and output, via the signal output terminal, an output signal generated according to the intermediate signal; and
    a signal delay setting circuit, coupled to the primary side circuit, and configured to calculate a delay time according to a voltage difference across the first signal input terminal and the second signal input terminal when the first power voltage is within a predetermined voltage range, and configured to delay one of the first input signal and the second input signal according to the delay time when the first power voltage is greater than an upper limit of the predetermined voltage range, to control a duty ratio of the output signal.

11. The isolation integrated circuit according to claim 10, wherein the signal delay setting circuit comprises:
a voltage drop generating circuit, configured to generate the voltage difference across the first signal input terminal and the second signal input terminal;
a delay time control circuit, coupled to the voltage drop generating circuit, wherein the delay time control circuit is configured to enable the voltage drop generating circuit to generate the voltage difference when the first power voltage is within the predetermined voltage range, and calculate the delay time according to the voltage difference; and
a signal delay circuit, coupled to the delay time control circuit, and configured to delay the one of the first input signal and the second input signal by the delay time when the first power voltage is greater than the upper limit of the predetermined voltage range.

12. The isolation integrated circuit according to claim 11, wherein the voltage drop generating circuit comprises:
a current generating circuit, coupled to the first power terminal and configured to output a detection current;
a resistor component, coupled between the first signal input terminal and the second signal input terminal; and
a switch circuit, coupled to the current generating circuit, the resistor component, and a first ground voltage, and configured to be turned on when the delay time control circuit enables the voltage drop generating circuit, to allow the detection current to flow through the resistor component, so that the voltage difference is generated across both ends of the resistor component.

13. The isolation integrated circuit according to claim 12, wherein the resistor component is arranged outside the isolation integrated circuit, and the current generating circuit and the switch circuit are arranged inside the isolation integrated circuit.

14. The isolation integrated circuit according to claim 12, wherein the switch circuit comprises:
a first switch, coupled between the current generating circuit and the first signal input terminal; and
a second switch, coupled between the second signal input terminal and a first ground terminal of the isolation integrated circuit, wherein the first ground terminal is configured to receive the first ground voltage.

15. The isolation integrated circuit according to claim 11, wherein the delay time control circuit comprises:
a voltage sensing circuit, configured to sense the voltage difference across the first signal input terminal and the second signal input terminal to output a sensed voltage value corresponding to the voltage difference;
a delay time calculation circuit, configured to calculate the delay time according to the sensed voltage value to output the delay time to the signal delay circuit;
a switch driving circuit, configured to control a switch circuit in the voltage drop generating circuit to be turned on or off; and
a central control circuit, coupled to the voltage sensing circuit, the delay time calculation circuit, and the switch driving circuit, and configured to control the voltage sensing circuit, the delay time calculation circuit, and the switch driving circuit.

16. The isolation integrated circuit according to claim 15, wherein the delay time control circuit further comprises:
a storage circuit, coupled to the voltage sensing circuit, the delay time calculation circuit, and the central control circuit, and configured to store the sensed voltage value to provide the sensed voltage value to the delay time calculation circuit.

17. The isolation integrated circuit according to claim 11, wherein the delay time control circuit calculates the delay time according to the voltage difference by using a look-up table or through formula calculation, and output the delay time to the signal delay circuit.

18. The isolation integrated circuit according to claim 11, wherein the signal delay circuit is coupled to the second signal input terminal, and is configured to delay a plurality of falling edges of the second input signal or a plurality of rising edges of an inverted second input signal by the delay time.

19. The isolation integrated circuit according to claim 11, wherein the predetermined voltage range is between a power-on reset voltage and an undervoltage lockout voltage.

20. A power conversion circuitry, comprising:
a high-side switch;
a low-side switch;
a controller circuit configured to output a first input signal and a second input signal;
a first isolation integrated circuit, coupled between the controller circuit and the high-side switch, wherein the first isolation integrated circuit has a first signal input terminal and a second signal input terminal, and comprises a first signal delay setting circuit, wherein the first isolation integrated circuit is configured to receive the first input signal via the first signal input terminal, receive the second input signal via the second signal input terminal, and generate, according to the first input signal and the second input signal, a first output signal for driving the high-side switch; and
a second isolation integrated circuit, coupled between the controller circuit and the low-side switch, wherein the second isolation integrated circuit has a third signal input terminal and a fourth signal input terminal, and comprises a second signal delay setting circuit, wherein the second isolation integrated circuit is configured to receive the second input signal via the third signal input terminal, receive the first input signal via the fourth signal input terminal, and generate, according to the first input signal and the second input signal, a second output signal for driving the low-side switch;
wherein when a first power voltage is within a predetermined voltage range, the first signal delay setting circuit calculates a first delay time according to a first voltage difference across the first signal input terminal and the second signal input terminal, and the second signal delay setting circuit calculates a second delay time according to a second voltage difference across the third signal input terminal and the fourth signal input terminal, and
wherein when the first power voltage is greater than an upper limit of the predetermined voltage range, the first signal delay setting circuit delays the second input signal according to the first delay time to control a duty ratio of the first output signal, and the second signal delay setting circuit delays the first input signal according to the second delay time to control a duty ratio of the second output signal, so that the high-side switch and the low-side switch are not turned on at the same time.

* * * * *